US005903444A

United States Patent [19]

Sekido et al.

[11] Patent Number: 5,903,444

[45] Date of Patent: May 11, 1999

[54] ELECTRICAL JUNCTION BOX ASSEMBLY WITH AN ELECTRICAL UNIT THEREIN

[75] Inventors: Toshihisa Sekido; Hideo Matsuoka, both of Yokkaichi, Japan

[73] Assignee: Sumitomo Wiring Systems, Ltd., Japan

[21] Appl. No.: 08/977,751

[22] Filed: Nov. 25, 1997

[30] Foreign Application Priority Data

Nov. 25, 1996 [JP] Japan .................................... 8-313687

[51] Int. Cl.[6] ........................................................ H05K 7/00

[52] U.S. Cl. .......................... 361/819; 361/728; 361/740; 220/3.2; 174/50

[58] Field of Search ..................................... 361/728, 730, 361/732, 740, 741, 747, 819, 823, 824, 641; 439/949; 220/3.2, 3.3, 3.8, 4.01–4.07; 174/50

[56] References Cited

U.S. PATENT DOCUMENTS

| | | | |
|---|---|---|---|
| 4,623,753 | 11/1986 | Feldman et al. | 174/50 |
| 5,435,453 | 7/1995 | Higuchi . | |
| 5,515,988 | 5/1996 | Oda | 220/38 |
| 5,531,345 | 7/1996 | Nakamura et al. | 220/3.8 |
| 5,621,618 | 4/1997 | Komiyama | 361/732 |
| 5,768,098 | 6/1998 | Murayama | 361/684 |

FOREIGN PATENT DOCUMENTS 129416 8/1986 Japan .

*Primary Examiner*—Leo P. Picard
*Assistant Examiner*—Jayprakash N. Gandhi
*Attorney, Agent, or Firm*—Jordan B. Bierman; Bierman, Muserlian and Lucas

[57] ABSTRACT

An electrical connection box having an L-shaped rib on the inside wall of its lower cover to engage a fitting projection located on the bottom face of an electrical unit housed within the box. The connection between the side wall of the lower cover and the electrical unit reinforces the area adjacent the notch through which the wires pass and securely maintains the electric unit inside the box.

4 Claims, 4 Drawing Sheets

ELECTRICAL JUNCTION BOX ASSEMBLY WITH AN ELECTRICAL UNIT THEREIN

This Application claims the benefit of the priority of Japanese Application 8-313687, filed Nov. 25, 1996.

BACKGROUND OF THE INVENTION

The present Invention relates to an electrical junction box for use in a motor vehicle and, more particularly, to reinforcing the area around the opening in the outer box, through which the wires pass while stabilizing the electrical unit contained therein.

Electrical junction boxes used in automobiles employ an outer box in which an electrical unit is housed. Typically, these electrical junction boxes are found in the engine compartment of a motor vehicle. The primary purpose of the outer box is to protect the electrical connection or electrical unit from dust and water. Conventionally, the outer box comprises an upper cover and a lower cover which fit around and house the electrical unit. Typically, the upper and lower covers of the outer box are made by molding resins or plastic. The outer box is often referred to as an auxiliary box while examples of electrical units, housed in the auxiliary box, include junction blocks, relay blocks, and fuse blocks.

In order to connect the electrical unit to the other electrical/mechanical parts of the vehicle, openings are generally molded into the lower cover of the outer box. These openings allow wires to pass into and out of the box.

FIGS. 1 and 2 illustrate a conventional electrical junction box arrangement used in a vehicle. Lower cover 1 has notch 1*a* disposed in its side wall. Typically, notch 1*a* is formed during the molding process and starts near the bottom surface of lower cover 1 and extends the complete length of the side wall as shown. Ledge 1*b* is disposed horizontally on the inner wall of lower cover 1 and typically extends around the complete inner perimeter surface thereof.

In order to assemble the electrical junction box, electrical unit 2, depicted as a relay block, is lowered into lower cover 1 through opening 1*c* until the bottom surface of electrical unit 2 rests on ledge 1*b*, as shown in FIG. 2. Wires are connected to electrical unit 2 and aligned with notch 1*a*; upper cover 3 is then placed on lower cover 1 and electrical unit 2 to complete the assembly.

A problem exists with the prior art arrangement in that, when notch 1*a* is large, the area around notch 1*a* in the side wall of lower cover 1 is weak. This is especially true if lower cover 1 has a plurality of notches. The overall strength of lower cover 1 may be insufficient to withstand the rigors of an automobile assembly plant or the life of the vehicle on the road. Decreasing the size of notch 1*a* is not a viable solution because it makes assembly difficult due to the number of wires that are connected to electrical unit 2.

Additionally, because electrical unit 2 merely rests on projection 1*b*, it is not securely held in the outer box and, vibrations due to the automobile traveling over the road, shake electrical unit 2 and can cause a weakening of the electrical connection between electrical unit 2 and the wires. The vibrations can also cause electrical unit 2 to shake inside the outer box and result in a noise which is annoying to the driver or passengers in the vehicle and result in the impression that something is wrong.

Furthermore, ledge 1*b* is usually positioned so that a portion of electrical unit 2 extends above the top of lower cover 1. This requires that the side wall of lower cover 1 meet the side wall of upper cover 3 in order to form a good dust proof and watertight seal.

SUMMARY OF THE INVENTION

It is the object of the present Invention to overcome the problems described above and to increase the strength and integrity of the electrical junction box. This is accomplished by employing an L-shaped rib on the inside of the side wall of the lower cover on both sides of the notch and a fitting projection near the bottom surface of the electrical unit. The fitting projection is located on the electrical unit at a location which corresponds to the location of the L-shaped rib on the side wall of the lower cover. The fitting projection of the electrical unit is held between the inner surface of the side wall of the lower cover and the vertical wall of the L-shaped rib.

By interposing the fitting projection of the electrical unit between the vertical wall of the rib and the side wall of the lower cover, the side wall of the lower cover is strengthened in the area of the notch and the electrical unit is held in place, thereby stabilizing the electrical unit and increasing the integrity of the electrical junction box.

Preferably, a groove is formed along the outer surface of the electrical unit near the bottom of the electrical unit, between the fitting projection and the side wall of the electrical unit. The depth and width of the groove correspond to the height and width of the vertical wall of the L-shaped rib. The vertical wall of the L-shaped rib is held in the groove between the side wall of the electrical unit and the fitting projection. Employing the groove further strengthens the overall integrity of the electrical junction box. Preferably, the fitting projection and groove are formed as an integral part of the electrical unit.

In an advantageous form of the Invention, the L-shaped rib extends around the entire perimeter of the inside of the side wall of the lower cover, except where the notch exists in the side wall. It is also preferred that the fitting projection extend around the entire perimeter of the electrical unit so that it engages the L-shaped rib along its entire length. Where a groove in the electrical unit so employed, the groove should, for best results, extend around the entire perimeter of the electrical unit.

It is also preferred that the L-shaped rib be positioned low enough in the lower cover so that the entire electrical unit is housed inside the lower cover, below the top edge thereof. This relative positioning of the lower cover and the electrical unit adds to the security and integrity of the electrical junction box.

It has been found that the opening made by the notch can be increased to facilitate insertion of a plurality of wires when employing the arrangement of the present Invention. Furthermore, by integrating the lower cover and the electrical box in a stable manner, the electrical unit is prevented from shaking in the outer box.

Additionally, since the structure for the lower cover involves a simple L-shaped projection, the structure of the mold used for molding the lower cover can be kept simple and the manufacture of the molds is inexpensive. Similarly, the structure of the electrical unit involves a fitting projection and optionally a groove so that the manufacture of the molds for the electrical unit is also inexpensive. Thus, the present Invention can be implemented without an increase in production costs.

BRIEF DESCRIPTION OF THE DRAWINGS

In the accompanying drawings, constituting a part hereof, and in which like reference characters indicate like parts.

DETAILED DESCRIPTION OF THE INVENTION

Figure 1:
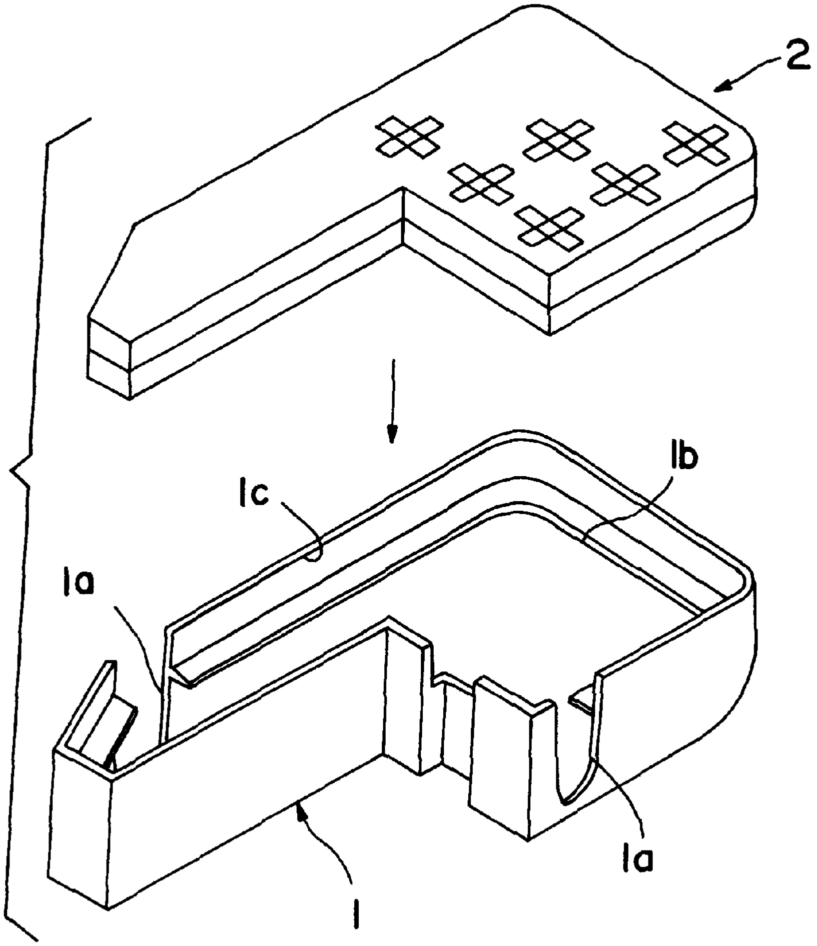
FIG.1 PRIOR ART
FIG. 1 is a view of a conventional electronic unit and a conventional lower cover of an electrical junction box.
Figure 2:
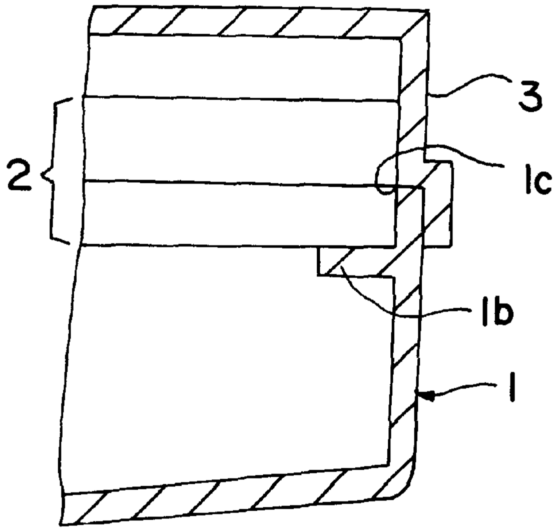
FIG.2 PRIOR ART
FIG. 2 is a cross-sectional view of a conventional electronic junction box.
Figure 3:
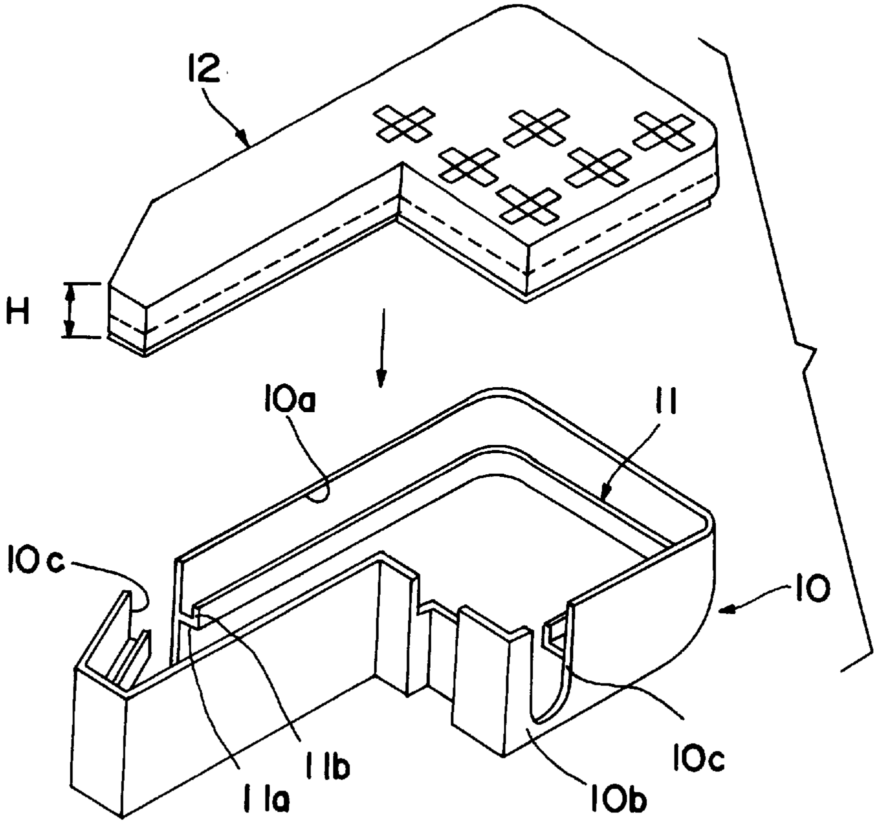
FIG. 3 is a view of an electrical unit and lower cover in accordance with the present Invention.
Figure 4:
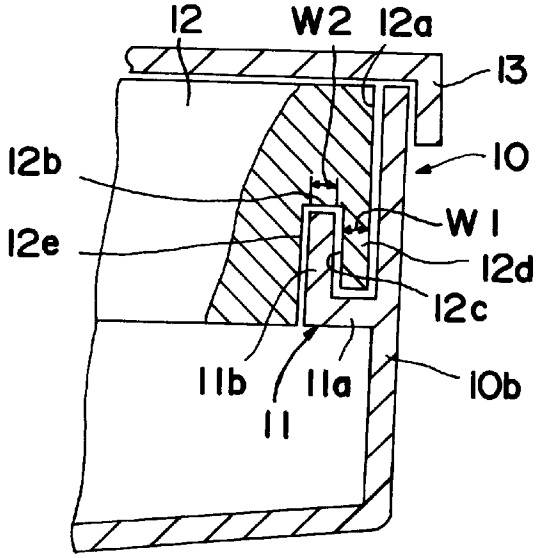
FIG. 4 is a cross sectional view of the electrical unit, upper cover, and lower cover of FIG. 3 assembled.

As shown in FIGS. 3 and 4, an electrical junction box comprises a lower cover 10, electrical unit 12 and an upper cover 13. Electrical unit 12 is illustrated as a relay block. Lower cover 10 is conventionally molded from a resin or plastic material. The top surface of lower cover 10 forms opening 10*a* to allow electrical unit 12 to be inserted into lower cover 10. Notch 10*c* is formed in side wall 10*b* of lower cover 10. Notch 10*c* allows wires to pass into the electrical connection box at a prescribed position. As shown, notch 10*c* extends from opening 10*a* to a point near the bottom wall of lower cover 10.

L-shaped rib 11 is shown in FIG. 3 as extending around the entire inside perimeter of the side wall 10*b*, except where notch 10*c* appears. L-shaped rib 11 is formed integrally on the inner surface of side wall 10*b*. L-shaped rib 11 comprises a horizontal wall 11*a* projecting from the inner surface of side wall 10*b* and a vertical wall 11*b* which projects upward from the end of horizontal wall 11*a*. L-shaped rib 11 is positioned so that the top of electrical unit 12 coincides with the top of lower cover 10.

As shown in FIG. 4, electrical unit 12 has groove 12*b* in its bottom portion and is located a prescribed distance away from its outer perimeter 12*a*. Between outer perimeter 12*a* of electrical unit 12 and outer surface 12*c* of groove 12*b* is positioned fitting projection 12*d*. Fitting projection 12*d* has a width W1 which allows fitting projection 12*d* to be inserted between inner surface of side wall 10*b* and vertical wall 11*b*. Width W2 of groove 12*b* allows vertical wall 11*b* to be inserted between outer surface 12*c* and inner surface 12*e* of groove 12*b*. Additionally, as shown in FIG. 4, the height of vertical wall 11*b* corresponds to the depth of groove 12*b* with the length of fitting projection 12*d* corresponding to the depth of the channel formed between inner side wall 10*b* and L-shaped rib 11.

In order to mount electrical unit 12 in lower cover 10, as shown in FIGS. 3 and 4, outer perimeter 12*a* of electrical unit 12 is guided along inner surface of side wall 10*b* of lower cover 10. Fitting projection 12*d* is inserted between vertical wall 11*b* of L-shaped rib 11 and inner surface of side wall 10*b*. At the same time, vertical wall 11*b* of L-shaped rib 11 is guided into groove 12*b*. Since both the left and right sides of notch 10*c* are interlocked with electrical unit 12, the area around notch 10*c* is reinforced.

Preferably, groove 12*b* and fitting projection 12*d* extend around the complete perimeter of electrical unit 12 and L-shaped rib 11 extends around the entire inner surface of side wall 10*b* so that the lock between groove 12*b*, L-shaped rib 11, and fitting projection 12*d* extends completely around the inner surface of side wall 10*b*. When both groove 12*b* and fitting projection 12*d* are used, a double-reinforced fit is provided, allowing side wall 10*b* to be reinforced around notch 10*c* and electric unit 12 to be securely positioned inside the junction box.

Figure 5:
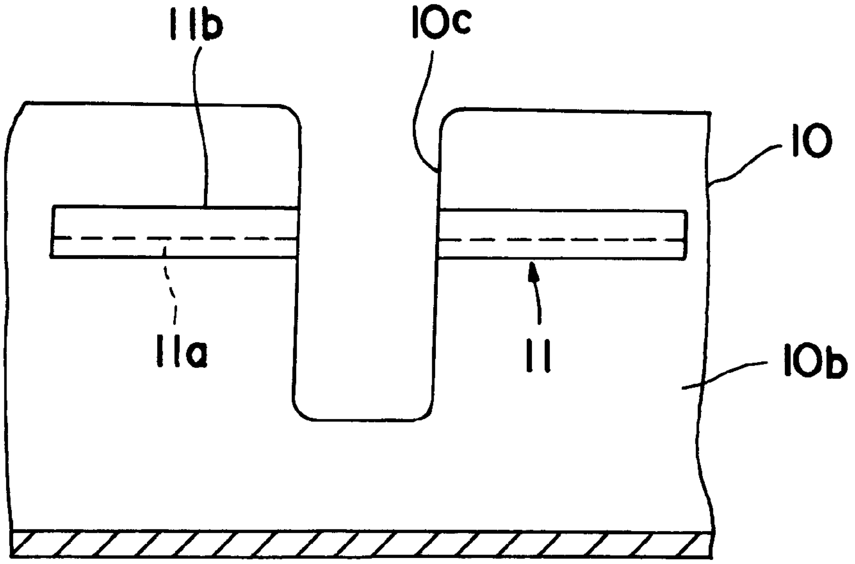
FIG. 5 is a side view of another embodiment of the lower cover in accordance with the present Invention.

It is within the preview of the present Invention that L-shaped rib 11 is only positioned on either side of notch 10*c* and that fitting projection 12*d* is only employed on either side of notch 10*c*. As shown in FIG. 5, the present Invention can be accomplished by employing L-shaped rib 11 only on the left and right sides of notch 10*c*. In this case, fitting projection 12*d* and optional groove 12*b* is employed to correspond with L-shaped rib 11. This arrangement provides reinforcement to notch 10*c* while maintaining the placement of electrical unit 12.

Figure 6:
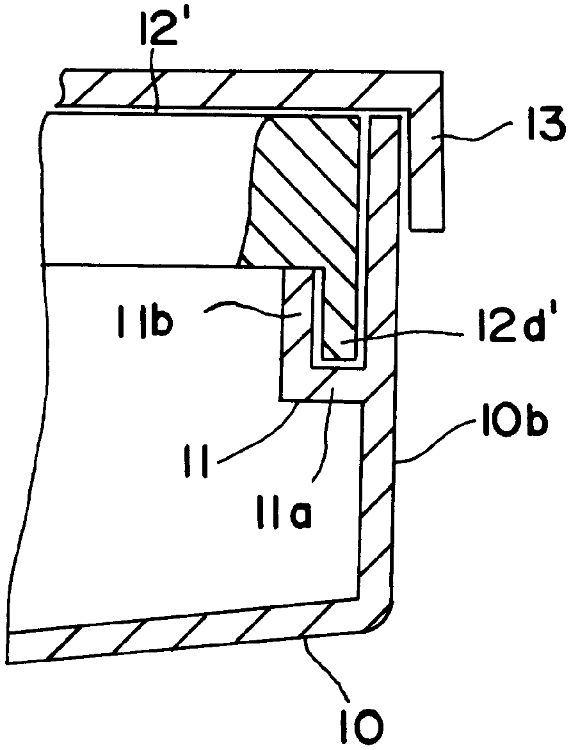
FIG. 6 is a cross-sectional view of another embodiment of the present Invention.

Alternatively, a fitting projection 12*d*$^1$, as shown in FIG. 6, is employed without the use of groove 12. In this case, fitting projection 12*d*$^1$ is projected downward from the outer perimeter 12*a* of electrical unit 12$^1$. In this configuration, fitting projection 12*d*$^1$ fits between vertical wall 11*b* of L-shaped rib 11 and inner side of side wall 10*b* of lower cover 10. Thus, lower cover 10 and electrical unit 12 fit integrally together and maintain the positioning of electrical unit 12 while reinforcing side wall 10*b* in the area of notch 10*c*.

Figure 7:
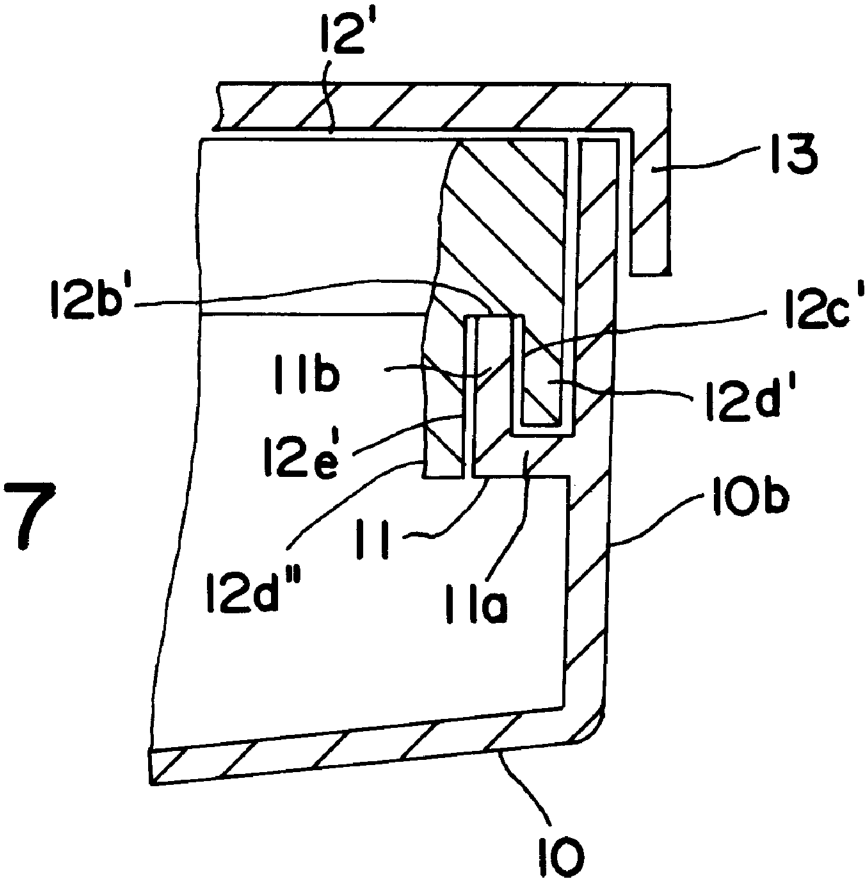
FIG. 7 is a cross-sectional view of yet another embodiment of the present Invention.

As shown in FIG. 7, the further embodiment of the present Invention contains groove 12*b*' which is made by employing two fitting projections 12*d*' and 12*d*'' in order to form groove 12*b*'. In this embodiment, vertical wall 11*b* fits between fitting projection 12*d*' and the second fitting projection 12*d*''. Inner surface 12*e*' and outer surface 12*c*' of groove 12 are on either side of vertical wall 11*b*. FIG. 7 shows an alternative embodiment for forming groove 12 with respect to electrical unit 12.

While only a limited number of specific embodiments of the present invention have been expressly disclosed, it is, nonetheless, to be broadly construed, and not to be limited except by the character of the clams appended hereto.

What we claim is:

1. An electrical junction box assembly comprising:

a connection box having an electrical unit therein;

said box having an upper cover and lower cover, said lower cover having an open upper side and a notch for insertion of wires cut into a side wall thereof, said notch extending from said upper side toward a bottom surface of said lower cover;

an L-shaped rib projecting from an inner surface of said side wall of said lower cover and disposed along substantially an entire perimeter of said inner surface of said side wall except for said notch;

a fitting projection disposed along substantially an entire perimeter of said electrical unit, said electrical unit being inserted into said lower cover through said upper surface opening, said fitting projection interposed between a vertical wall of said L-shaped rib and said inner surface of said side wall of said lower cover, thus causing said lower cover and said electrical unit to be affixed to each other and reinforcing an area around said notch.

2. The assembly of claim 1 wherein there is a groove in a bottom face of said electrical unit spaced apart inwardly from an outer perimeter of said unit;

said fitting projection being between said groove and said outer perimeter of said unit, and said vertical wall of said L-shaped rib being in said groove.

3. An improved electrical junction box assembly having a box including a lower cover and an upper cover, an electrical unit disposed therein and a notch in a side wall of said lower cover for passage of wires, said assembly comprising:

an L-shaped rib projecting from an inner surface of said side wall of said lower cover and disposed along substantially an entire perimeter of said inner surface of said side wall except for said notch;

a fitting projection along substantially an entire perimeter of said electrical unit, said electrical unit being inserted into said lower cover through an upper surface opening therein, said fitting projection between a vertical wall of said L-shaped rib and said inner surface of said side wall of said lower cover, thus causing said lower cover and said electrical unit to be affixed to each other and reinforcing an area around said notch.

4. The assembly of claim 3 wherein there is a groove in a bottom face of said electrical unit spaced apart inwardly from an outer perimeter surface of said unit;

said fitting projection is formed between said groove and an outer perimeter surface of said unit, and said vertical wall of said L-shaped rib being in said groove.

* * * * *